United States Patent
Matsui

(10) Patent No.: US 6,466,067 B2
(45) Date of Patent: Oct. 15, 2002

(54) PLL CIRCUIT WITH SHORTENED LOCK-UP TIME

(75) Inventor: Naohiro Matsui, Tokyo (JP)

(73) Assignee: NEC Corporation (JP)

(*) Notice: Subject to any disclaimer, the term of this patent is extended or adjusted under 35 U.S.C. 154(b) by 0 days.

(21) Appl. No.: 09/921,625

(22) Filed: Aug. 3, 2001

(65) Prior Publication Data

US 2002/0070779 A1 Jun. 13, 2002

(30) Foreign Application Priority Data

Aug. 4, 2000 (JP) .................................... 2000-236504

(51) Int. Cl.$^7$ ................................................ H03L 7/06
(52) U.S. Cl. ............... 327/156; 327/147; 327/557; 375/376; 331/DIG. 2; 331/17
(58) Field of Search .................. 327/145–148, 327/155–157, 162, 163, 551–553, 557, 558, 563; 375/373–376; 331/2, 16, 25, 18, 1 A, DIG. 2, 177 R, 12, 40, 17; 365/233, 233.5

(56) References Cited

U.S. PATENT DOCUMENTS

| | | | |
|---|---|---|---|
| 4,862,106 A | * | 8/1989 | Toda et al. ................ 331/2 |
| 5,347,233 A | | 9/1994 | Ishibashi et al. ............ 331/2 |
| 6,028,460 A | | 2/2000 | McCollum et al. .......... 327/105 |
| 6,054,903 A | | 4/2000 | Fiedler .................... 331/17 |
| 6,118,345 A | * | 9/2000 | Scheffold .................. 327/156 |
| 6,150,890 A | * | 11/2000 | Damgaard et al. ........... 331/14 |
| 6,215,362 B1 | * | 4/2001 | Feng et al. ................ 327/156 |

FOREIGN PATENT DOCUMENTS

| | | | |
|---|---|---|---|
| EP | 0856946 A2 | 1/1998 | ........... H03L/7/085 |
| EP | 1005167 A1 | 11/1999 | ........... H03L/7/187 |
| JP | 63-288518 | 11/1988 | ............. H03L/7/10 |
| JP | 5-259902 | 10/1993 | ........... H03L/7/107 |
| WO | WO 98/48513 | * 10/1998 | ........... H03L/7/113 |

* cited by examiner

Primary Examiner—Timothy P. Callahan
Assistant Examiner—Minh Nguyen
(74) Attorney, Agent, or Firm—Hayes Soloway, P.C.

(57) ABSTRACT

BPF having a band width of |reference signal $f_{REF}$-mixer output signal $f_{MIX\ OUT}$| is connected to a phase comparator. When an output signal corresponding to the passage of this band width has been obtained, a changeover switch is turned OFF. Upon detection such that the PLL circuit is unlockable, an output signal is obtained from an offset differential pair circuit, the changeover switch is turned ON, and the time constant of LPF is reduced to shorten the lock-up time, and the voltage applied to VCO is made larger than the usual voltage. By virtue of this construction, a PLL circuit of an analog system can be realized which can shorten the lock-up time and, in addition, can reduce noise and spurious harmonics.

14 Claims, 6 Drawing Sheets

FREQUENCY CHARACTERISTIC OF BAND PASS FILTER

PLL CIRCUIT WITH SHORTENED LOCK-UP TIME

FIELD OF THE INVENTION

The invention relates to a PLL (phase-lock loop) circuit, and more particularly to a PLL circuit which can shorten lock-up time.

BACKGROUND OF THE INVENTION

Shortening the lock-up time (or settling time) of a phase comparator circuit is required of PLL circuits used in ICs (or LSIs) of mobile radio equipment and the like. Shortened lock-up time (time elapsed until the frequency difference becomes zero (0)) can be achieved by increasing the band width of a loop filter. Increasing the loop band, however, poses problems of a deterioration in C/N (signal-to-noise ratio) at the output terminal of VCO (voltage controlled oscillator) and an increase in spurious harmonics. For example, Japanese Patent Laid-Open No. 215171/1998 discloses a PLL circuit for solving this problem. This PLL circuit will be explained in conjunction with FIG. 1.

An adder 102 is connected to a current output-type phase comparator (PD) 101 into which an input signal frequency fIF is input. A constant-current source 103, a reset switch 104, and a low pass filter (LPF) 105 are connected to the adder 102. VCO 106 for outputting a VCO output frequency fRF is connected to LPF 105. A coupler 107 is connected to this VCO 106, and a mixer 108, into which a local signal frequency fLO is input, is connected between the coupler 107 and PD 101. In this construction, PD 101, LPF 105, VCO 106, and the mixer 108 basically constitute the PLL circuit. This construction is characterized by providing a constant current source 103 and a reset switch 104. The constant current source 103 functions to apply constant current to LPF 105.

The operation of the PLL circuit shown in FIG. 1 will be explained. In PD 101, the phase of the input signal frequency fIF is compared with the phase of the reference signal frequency fRF, and a current proportional to the phase difference is output. When the PLL circuit is in a standby state, a reset switch 104 is turned ON, whereupon charges accumulated in a capacitor of LPF 105 are discharged, and VCO control voltage is brought to the ground state (0 V). During the operation of PLL, the reset switch 104 is turned OFF, and charges are accumulated in the capacitor within LPF 105 by a constant-current source 103 to increase the accumulation speed (to shorten the time elapsed until the VCO control voltage is increased from 0 V to a desired voltage). This can shorten the lock-up time.

In order to shorten the settling time of PLL, a constant current output from the constant current source 103 is added to the output current of PD 101, and the total current is input into LPF 105. In LPF 105, unnecessary harmonic components and noises in the input total current are removed, followed by conversion to DC voltage which is input into VCO 106. The output frequency fRF of VCO 106 is input into the mixer 108 through the coupler 107. A mixer 108 mixes an output frequency fRF with a local signal frequency fLO. The output frequency fREF of the mixer 108 is given by fREF=fLO−fRF. The output frequency fRF of the mixer, when PLL is locked, is equal to the input signal frequency fIF. Therefore, fIF is converted to fREF=fLO−fIF.

As described above, a direct current component of the output current from PD 101 accumulates charges in the capacitor of LPF 105, and the output voltage is input into VCO 105. At the same time, the constant current output from the constant current source 103 is also accumulated in the above capacitor. As a result, as compared with the case where the constant current source 103 is not provided, the accumulation speed of charges in the capacitor is increased. Therefore, the settling time of PLL is shortened.

Japanese Patent Laid-Open Nos. 288518/1988 and 259902/1993 propose a PLL circuit having a construction such that the time constant of LPF is variable and, at power-on time and at the time of becoming unlocked upon a change of the division ratio of a frequency divider, the time constant is changed and, after locking, the time constant is returned to the previous value.

According to the conventional PLL circuit, however, also when PLL is locked, the constant current source 103 is operated. In this case, when the set current of the constant current source 103 is excessive, an increase in output voltage of the phase comparator 101 is faster than the following of PLL per se and PLL is unlocked. Therefore, a limitation is imposed on current setting.

Further, since the constant current source is operated also when PLL is locked, the phase comparator 101 sometimes cannot maintain a phase difference of 90 degrees relative to two signals of input fIF and fREF. This poses a problem of an increase in noise and spurious harmonics on the output side.

The application of all the PLL circuits of the above-described publications to a digital system is contemplated, and these PLL circuits cannot be applied to an analog system having frequency width. That is, in the digital system, the use of a frequency divider, which is unnecessary in the analog system, is indispensable. Further, Japanese Patent Laid Open No. 288518/1988 does not show how to generate time constant switch signal output at the time of unlocking. In Japanese Patent Laid-Open No. 259902/1993, a division ratio is necessary in a computing equation for judging the phase difference, and, in this case, the use of a frequency divider, which is unnecessary in the analog system, is indispensable.

SUMMARY OF THE INVENTION

Accordingly, it is an object of the invention to provide a PLL circuit which can shorten the lock-up time of PLL of an analog system.

It is another object of the invention to provide a PLL circuit which, even when the lock-up time is shortened using a constant current source, does not cause a limitation on current setting.

According to the first feature of the invention, a PLL circuit comprises:

a phase comparator which outputs, as a phase difference signal, a difference in phase between first and second input signals;

a loop filter which smoothens the output of the phase comparator and outputs a smoothened output;

VCO (voltage control oscillator) which receives as input the smoothened voltage output from the loop filter and oscillates at a frequency depending upon said received smoothened voltage;

a mixer which is provided between said VCO and the phase comparator and generates, as the second input signal, a signal of which a target frequency is the frequency of the first input signal;

a detector which detects, based on said phase differential signal output from the phase comparator, whether or not PLL (phase-lock loop) lock is possible, wherein the detector comprises a band pass filter which has a band width corresponding to a difference in frequency between the first and second input signals and receives as input said phase differential signal output from the phase comparator, and a differential pair circuit which receives as input a voltage signal output from the band pass filter and outputs a voltage corresponding to a voltage signal output received from said band pass filter; and switch means which, when the detector has detected that PLL lock is impossible, switches the loop filter so that the response of the loop filter is enhanced.

According to this construction, when the detector has detected such a state the PLL circuit is unlockable, the switch means switches the loop filter so that the response is enhanced, whereby the input voltage of VCO is rapidly increased. On the other hand, when the PLL circuit is lockable, the loop filter is brought to a usual operation state. By virtue of this, the rise in VCO is rapid, and the lock-up time is shortened. In addition, unnecessary spurious harmonics can be reduced.

According to the second feature of the invention, a PLL circuit comprises:

a current output-type phase comparator which outputs, as a phase difference signal, a difference in phase between first and second input signals;

a loop filter which smoothens the output of the current output-type phase comparator and outputs a smoothened output;

a constant current source for supplying current to the loop filter at a predetermined time;

a detector which detects, based on said phase differential signal output from the phase comparator, whether or not said PLL lock is possible;

a reset switch coupled to said detector, said reset switch connected between the input terminal of the loop filter and the ground and, when PLL (phase-lock loop) lock is possible, is turned off and, when said PLL lock is impossible, is turned on;

VCO (voltage control oscillator) which receives as input the smoothened output voltage from the loop filter and oscillates at a frequency depending upon said received smoothened voltage;

a mixer which is provided between said VCO and the phase comparator and generates, as the second input signal, a signal of which a target frequency is the frequency of the first input signal;

switch means which, when the detector has detected that PLL lock is impossible, turns on the constant current source.

According to this construction, when the detector has detected such a state that the PLL circuit is unlockable, the switch means turns on the constant current source to allow a current to flow from the constant current source to the loop filter, thereby permitting the capacitor of the loop filter to be rapidly charged. On the other hand, when the PLL circuit is lockable, the constant current source is turned off and is separated from the input terminal of the loop filter. By virtue of this, the rise in VCO is rapid, and the lock-up time is shortened. In addition, unnecessary spurious harmonics can be reduced, and there is no limitation on current setting.

BRIEF DESCRIPTION OF THE DRAWINGS

The invention will be explained in more detail in conjunction with the appended drawings, wherein.

DESCRIPTION OF THE PREFERRED EMBODIMENTS

Preferred embodiments of the invention will be explained with reference to the accompanying drawings.

First; Preferred Embodiment

Figure 2:
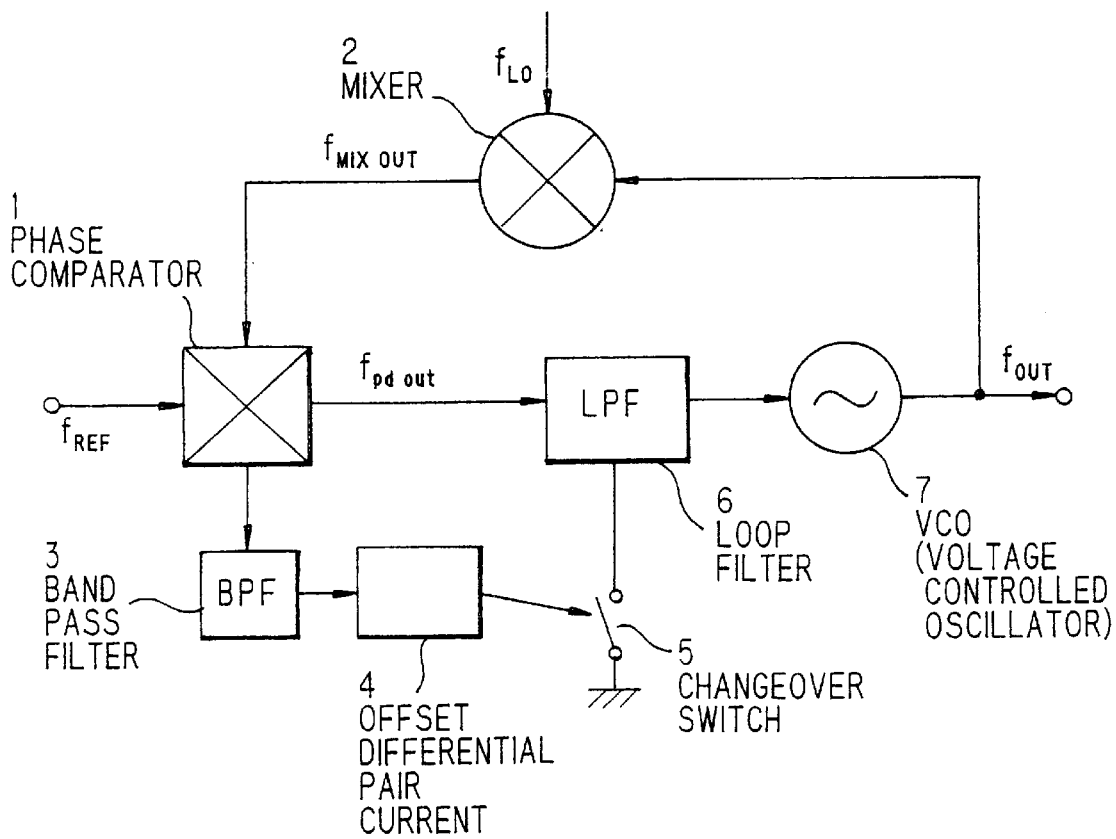
FIG. 2 is a block diagram showing a first preferred embodiment of the PLL circuit according to the invention.

FIG. 2 shows a first preferred embodiment of the PLL circuit according to the invention.

The PLL circuit according to the invention is of an analog system and comprises: a phase comparator 1 into which a reference signal $f_{REF}$ (first input signal) and a mixer output signal $f_{MIX\ OUT}$ (second input signal) are input; a mixer 2 for generating a mixer output signal $f_{MIX\ OUT}$ based on a local signal frequency $f_{LO}$; a band pass filter (BPF) 3 connected to the phase comparator 1; an offset differential pair circuit 4 connected to this BPF 3; a changeover switch 5 (switch means) wherein switching is carried out by the offset differential pair circuit 4; a loop filter (LPF) 6 connected to the phase comparator 1; and VCO 7 which generates a VCO output signal $f_{OUT}$ based on the output voltage of this LPF 6 and, in addition, applies the VCO output signal $f_{OUT}$ to the mixer 2.

The phase comparator 1 is provided with a circuit having a Gilbert cell mixer construction, and an input terminal of BPF 3 is connected to an output terminal of the circuit. BPF 3 and the offset differential pair circuit 4 constitute one detector. LPF 6 is constituted using a lag-lead filter or an active filter. When the changeover switch 5 is ON, LPF 6 is set to a time constant during the usual operation, while when the changeover switch 5 is OFF, LPF 6 is separated from the ground and is set to a time constant value smaller than the above time constant.

Figure 3:
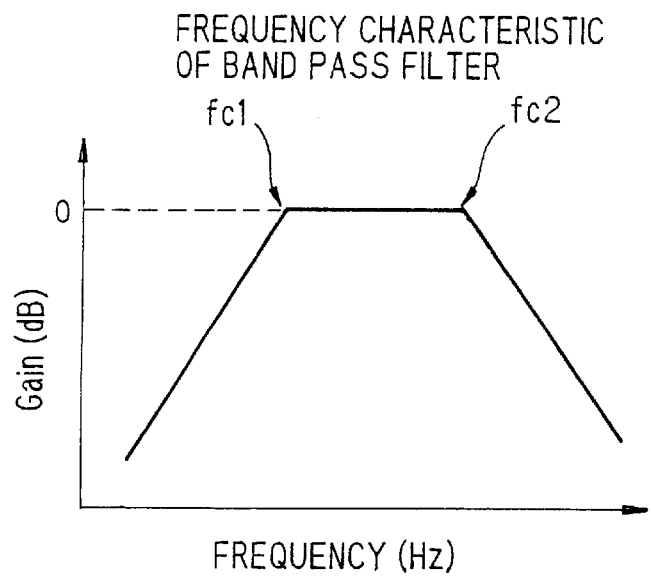
FIG. 3 is a characteristic diagram showing frequency characteristics of a band pass filter (BPF) shown in FIG. 2.

FIG. 3 shows frequency characteristics of BPF 3.

In FIG. 3, a first cut-off frequency fc1 is set so as to conform to the frequency range in the capture range of the PLL circuit, and a second cut-off frequency fc2 is set so as to conform to the operation frequency range (synchronous holding range) of VCO 7. When characteristics shown in FIG. 3 are satisfied, the PLL circuit is judged to be lockable.

Next, the basic operation of the PLL circuit shown in FIG. 2 will be explained. The VCO output signal $f_{OUT}$ output from VCO 7 is input into the mixer 2 in a feedback loop. A mixer output signal $f_{MIX\ OUT}=|f_{OUT}-f_{LO}|$ is output from this mixer 2 and is applied to the phase comparator 1. The phase comparator 1 generates a voltage signal corresponding to the phase difference caused between the reference signal $f_{REF}$ and the mixer output signal $f_{MIX\ OUT}$ and inputs the voltage signal into LPF 6. LPF 6 has a predetermined time constant, and, in addition, functions to remove an unnecessary signal component contained in the input signal and to generate direct current output voltage. This direct current output voltage is applied as control voltage to VCO 7. In the phase comparator 1, when $f_{REF}=f_{MIX\ OUT}$ has been established, PLL becomes locked.

Next, the characteristic feature of the invention will be explained. Another output signal of the phase comparator 1 is input into BPF 3, and only a signal having a predetermined frequency region is input into the offset differential pair circuit 4. The offset differential pair circuit 4 generates a signal for switching the changeover switch 5, and sends a control signal to the changeover switch 5. When this changeover switch 5 is OFF, LPF 6 is set to a small time constant value and is operated so that the response is enhanced. This can accelerate the lead-in process until the VCO voltage in VCO 7 reaches a desired value. When VCO 7 has been led to desired VCO voltage, the PLL circuit is locked in. Thus, by virtue of the construction of LPF 6 which can switch the time constant, the lock-up time is shortened, and, in addition, noise and spurious harmonics are reduced. Further, since there is no need to perform external control, this is also suitable for IC construction.

The response of LPF 6 may be enhanced by increasing the output voltage of LPF 6 in a short time to a large value, For example, the value of a capacitor or resistor constituting the time constant circuit of LPF 6 is varied. That is, the time constant is increased in the case of a value falling within the capture range of the PLL circuit, while the time constant is decreased in the case of a value outside the capture range. Thus, the charge time of the capacitor is made shorter than the usual charge time. Specifically, a construction may be adopted wherein two capacitors may be connected parallel to each other and one of the two capacitors is turned ON/OFF. Alternatively, a construction may be adopted wherein two resistors are connected in series and one of the two resistors is short-circuited or insertion-connected.

Figure 4:
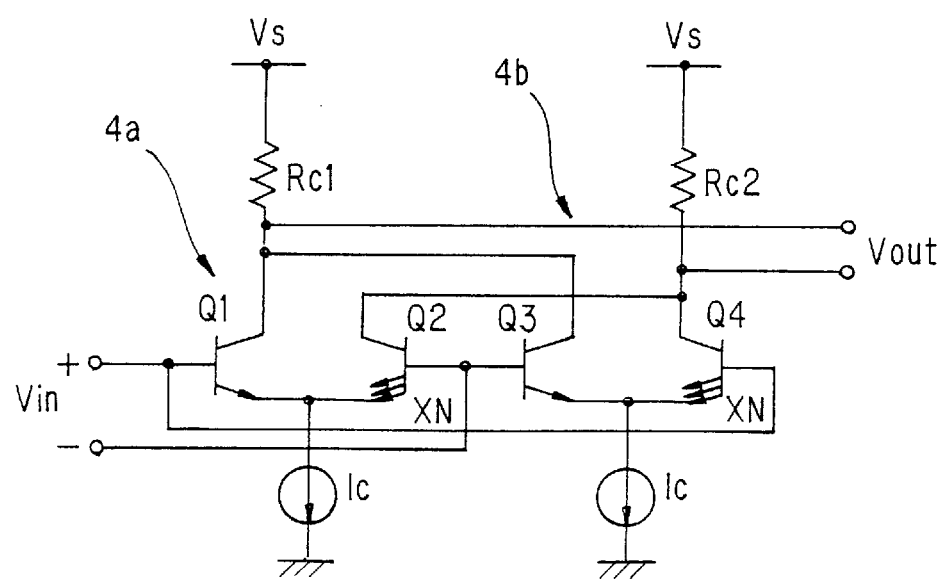
FIG. 4 is a block diagram showing the details of an offset differential pair circuit shown in FIG. 2.

FIG. 4 shows the details of an offset differential pair circuit 4.

The offset differential pair circuit 4 comprises a first differential amplifier 4a and a second differential amplifier 4b. The first differential amplifier 4a comprises transistors Q1, Q2 and a resistor Rc1, and the second differential amplifier 4b comprises transistors Q3, Q4 and a resistor Rc2. The transistors Q2, Q4 have an emitter area obtained by multiplying the emitter area of the transistors Q1, Q3 by a predetermined value, N. The use of transistors having this structure can provide characteristics shown in FIG. 5.

An input voltage $V_{in}$ (=output voltage of BPF 3) is input into each base of the transistors Q1, Q4. On the other hand, each base of the other transistors is grounded, or alternatively, a predetermined bias voltage is applied thereto. Each emitter of the transistors Q1 to Q4 is grounded. The collector of the transistor Q1 is connected to the collector of the transistor Q3, and, likewise, the collector of the transistor Q2 is connected to the collector of the transistor Q4. The collector of the transistor Q1 and the collector of the transistor Q3 are connected to each other, and are connected to a power source $V_s$ through a resistor Rc1. Likewise, the collector of the transistor Q2 and the collector of the transistor Q4 are connected to each other, and are connected to a power source $V_s$ through a resistor Rc2.

When the input voltage $V_{in}$ is 0 V, no current flows through the transistors Q1, Q3. Therefore, the output difference voltage $V_{out}$ is close to the value of the power source $V_s$. On the other hand, when the input voltage $V_{in}$ is a positive voltage, the transistors Q1, Q3 are conducted and a voltage ($V_S>V_{out}$) corresponding to the conducting state is output from the resistor RC1 side. When a negative input voltage $V_{in}$ is input, a voltage having reversed polarity corresponding to the conducting state of the transistors Q1, Q4 is output from the resistor Rc2 side.

Figure 5:
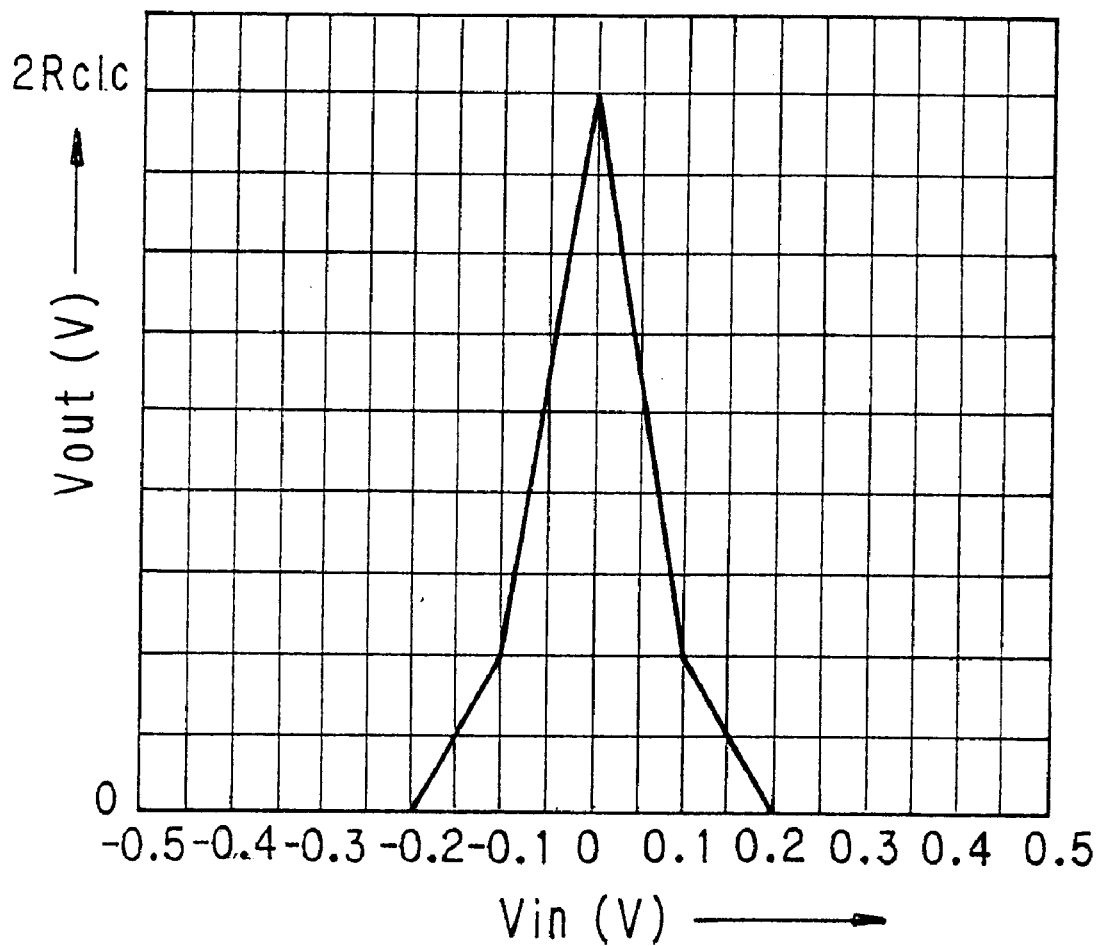
FIG. 5 is a characteristic diagram showing characteristics of input voltage vs output voltage in the offset differential pair circuit shown in FIG. 4.

FIG. 5 shows characteristics of input voltage vs. output voltage of the offset differential pair circuit 4 shown in FIG. 4. As is apparent from FIG. 5, in the offset differential pair circuit 4 shown in FIG. 4, when the input voltage $V_{in}$ is not less than about 200 mV, the output difference voltage $V_{out}$ is brought to zero (0). On the other hand, when the input voltage $V_{in}$ is not more than about 200 mV, the output difference voltage $V_{out}$ has a difference voltage value. Specifically, when $V_{in}$=0 mV, the difference voltage is $V_{out}$=2RcIc wherein Ic represents collector current of differential amplifiers 4a, 4b which is substantially equal to the emitter current. Thus, a complete switching operation can be provided.

Next, the lock/unlock operation of the PLL circuit shown in FIG. 2 will be explained.

When the PLL circuit is in an unlocked state ($f_{REF} \ne f_{MIX\ OUT}$), a signal having a frequency component of $|f_{REF}-f_{MIX\ OUT}|$ is output as an output signal $f_{pd\ out}$ of the phase comparator 1. This output signal is subjected to the following treatment according to whether or not the output signal falls within the capture range of the PLL circuit:

(1) When the output signal $f_{pd\ out}$ falls within the capture range of the PLL circuit. the PLL lock is possible. Therefore, in BPF 3, a signal component of $|f_{REF}-f_{MIX\ OUT}|$ is removed. Only DC voltage is output from BPF 3, and the difference potential becomes zero (0). The Output signal of BPF 3 is input into the offset differential pair circuit 4. Since, however. the difference potential is zero (0), the output potential of the offset differential pair circuit 4 has a difference potential of 2Rc1 Ic (or 2Rc2 Ic). The changeover switch 5 is operated (ON) by this difference voltage (2RcIc), and LPF 6 is brought to a usual operational state. This permits the PLL circuit to be locked in.

(2) when the signal having a frequency component of an output signal $f_{pd\ out}$ (=$|f_{REF-fMIX\ OUT}|$) from the phase comparator 1 does not fall within the capture range of the PLL circuit, BPF 3 filters the frequency component of the output signal $f_{pd\ out}$ of the characteristics shown in FIG. 3, and inputs this output into the offset differential pair circuit 4. When the amplitude of the voltage applied to the offset differential pair circuit 4 is about 200 mV, as shown in FIG. 3, a signal, wherein the average difference voltage is zero, is output. During the output of this signal (output voltage=0 V), the changeover switch 5 is in an off state.

When the changeover switch 5 is in the off state (when LPF 6 is released from ground), for the voltage amplitude of the output signal $f_{pd\ out}$ (=$|f_{REF}-f_{MIX\ OUT}|$) from the phase comparator 1, a large output voltage is applied to VCO 7 by the terminal voltage of the satisfactorily charged capacitor. The input of large voltage amplitude into VCO 7 shortens the lead-in time of the PLL circuit. When the output signal $f_{pd\ out}$ from the phase comparator 1 falls within the capture range, the operation becomes as described in item (1).

Second Preferred Embodiment

Next, the second preferred embodiment of the invention will be explained.

Figure 6:
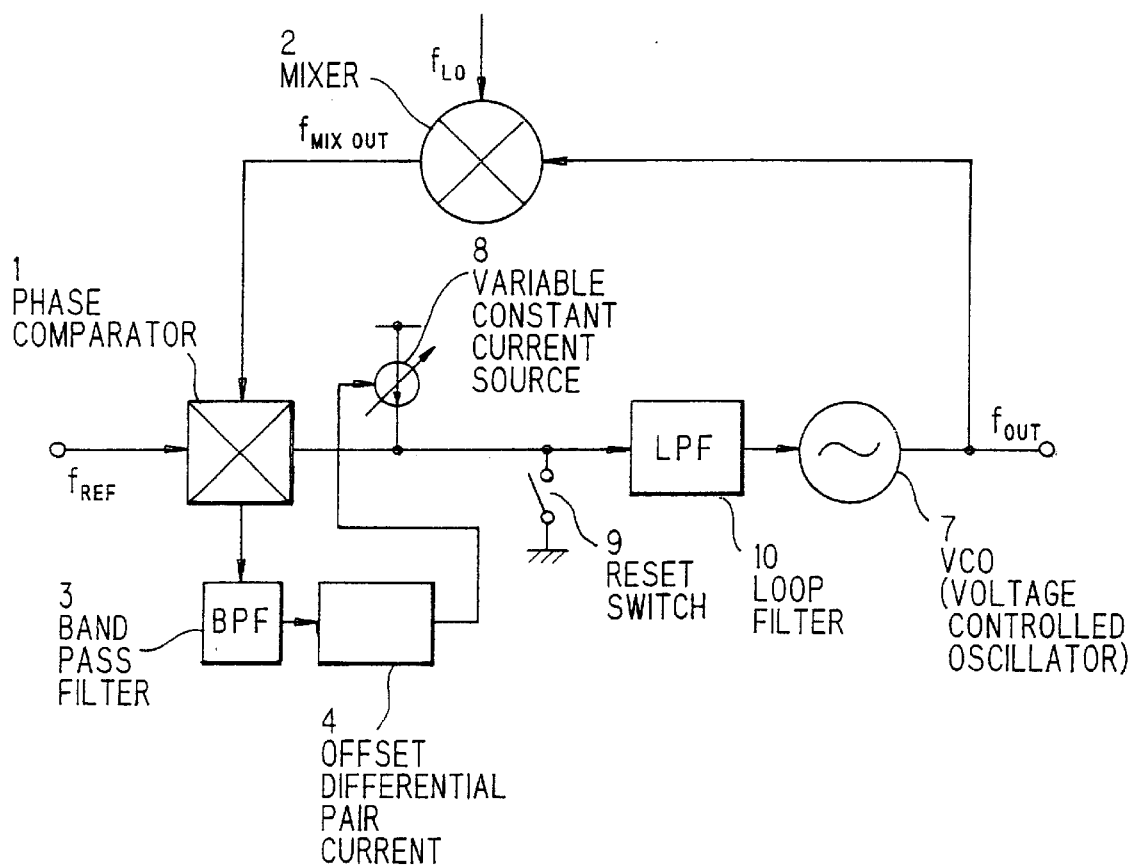
FIG. 6 is a block diagram showing a second preferred embodiment of the invention.

FIG. 6 shows the second preferred embodiment of the invention. Like parts are identified with the same reference numerals throughout FIG. 6 and FIG. 2, and the overlapping explanation will be omitted.

This preferred embodiment is characterized in that LPF 6 is replaced by LPF 10, which does not undergo any external control, that is, has a fixed time constant, a variable constant current source 8 is connected between the output line of the phase comparator 1 and the power source VS, and, in addition, a reset switch 9 is disposed instead of the changeover switch 5. Since the variable constant current source 8 is used, current output type is used in the phase comparator 1. The variable constant current source 8 is controlled by the offset differential pair circuit 4. There is no particular limitation on current setting of the variable constant current source 8. Preferably, however, the current is set to a value suitable for the circuit used.

When the PLL circuit is not in operation (for example, at the time of the switching of the frequency channel and at the turn-on time of the power), the reset switch 9 is automatically turned ON by a detector and a controller (not shown), and the charges accumulated in the capacitor in LPF 10 are discharged to ground. This brings the control voltage of VCO 7 to zero (0) V. When the constant current source is provided, the use of the reset switch 9 is indispensable. The provision of the reset switch 9 can eliminate the limitation of the current value of the variable constant current source 8, and the follow-up with respect to a variation in frequency, in such a direction that causes a lowering in voltage of VCO, can be enhanced.

Next, during the operation of the PLL circuit, the reset switch 9 is turned OFF. Just as the reset switch 9 has been turned OFF, the control voltage of VCO 7 is 0 V and the output signal $f_{out}$ of VCO 7 is in the lower limit of the operation oscillation frequency. At that time, when the output signal $f_{pd\ out}$ (=|$f_{REF}$−$f_{MIX\ OUT}$|) of the phase comparator 1 does not fall within the capture range of the PLL circuit, as described above, BPF 3 and the offset differential pair circuit 4 are operated and the variable constant current source 8 is turned ON.

The variable constant current source 8 supplies current to LPF 10. and charges the capacitor within LPF 10 independently of the output of the phase comparator 1. This permits the output voltage of LPF 10 to be linearly increased from 0 V with the elapse of time. Upon this operation, the output signal $f_{OUT}$ of VCO 7 is increased from the lower limit of the operation oscillation frequency. In the course of an increase in oscillation frequency, when the output signal $f_{pd\ out}$ of the phase comparator 1 falls within the capture range of the PLL circuit, output takes place in BPF 3 and the offset differential pair circuit 4, the operation of the variable constant current source 8 is turned OFF, and the PLL circuit is led to lock-in.

Thus, in the second preferred embodiment of the invention, when the PLL circuit cannot be locked, the control voltage (input voltage) of VCO 7 is brought to zero (0) V, while, at the time of the operation of PLL, the control voltage of VCO 7 is rapidly increased from 0 V to a value around a desired voltage by the current supplied from the variable constant current source 8. When PLL operation falls within the capture range, the operation of the variable constant current source 8 is turned OFF and the PLL circuit is led to lock-in by the original PLL operation. This shortens the lock-up time. Further, even when lock-up has been done using the constant current source, there is no limitation on current setting. Furthermore, spurious noise and harmonics are reduced.

Here a difference in construction between FIG. 6 and FIG. 1 will be explained. In the construction shown in FIG. 1, even when PLL is locked, the constant current source 103 continues to supply current. Therefore, the difference in phase between two input signals (fIF and fREF) in the phase comparator circuit 101 is not 90 degrees. For this reason, an unnecessary spurious harmonics component contained in the output signal from the phase comparator 101 is increased.

According to the construction shown in FIG. 6, however, when PLL is locked, the variable constant current source 8 is in an OFF state. Therefore, the difference in phase between the reference signal $f_{REF}$ in the phase comparator 1 and the mixer output signal $f_{MIX\ OUT}$ becomes 90 degrees. The phase difference of 90 degrees between the two input signals results in the suppression of the spurious harmonics which appears in the output of the phase comparator 101.

Third Preferred Embodiment

Figure 1:
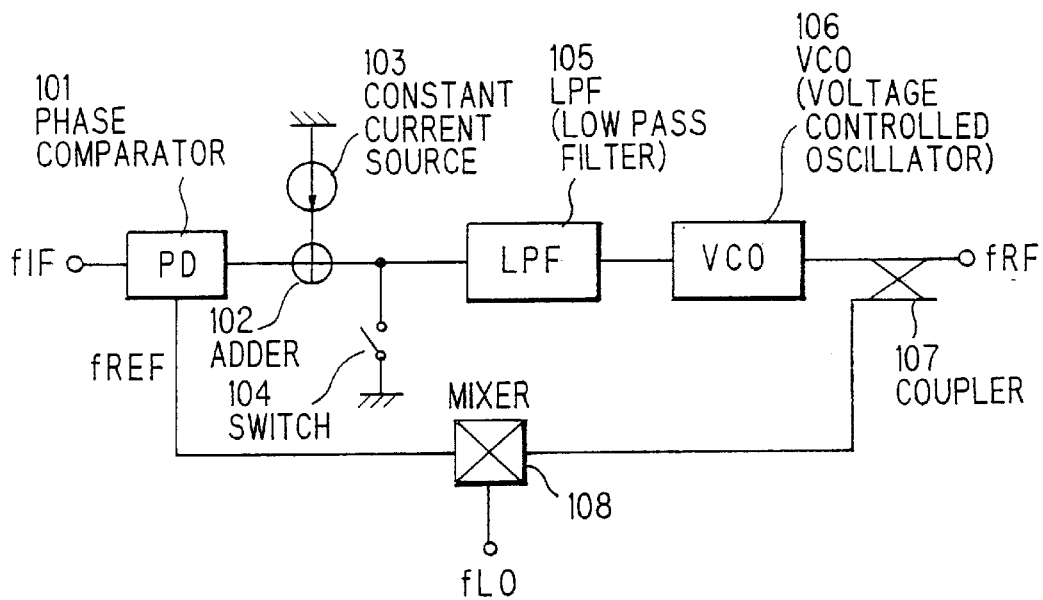
FIG. 1 is a block diagram showing a conventional PLL circuit.

FIG. 1 shows a third preferred embodiment of the invention.

Figure 7:
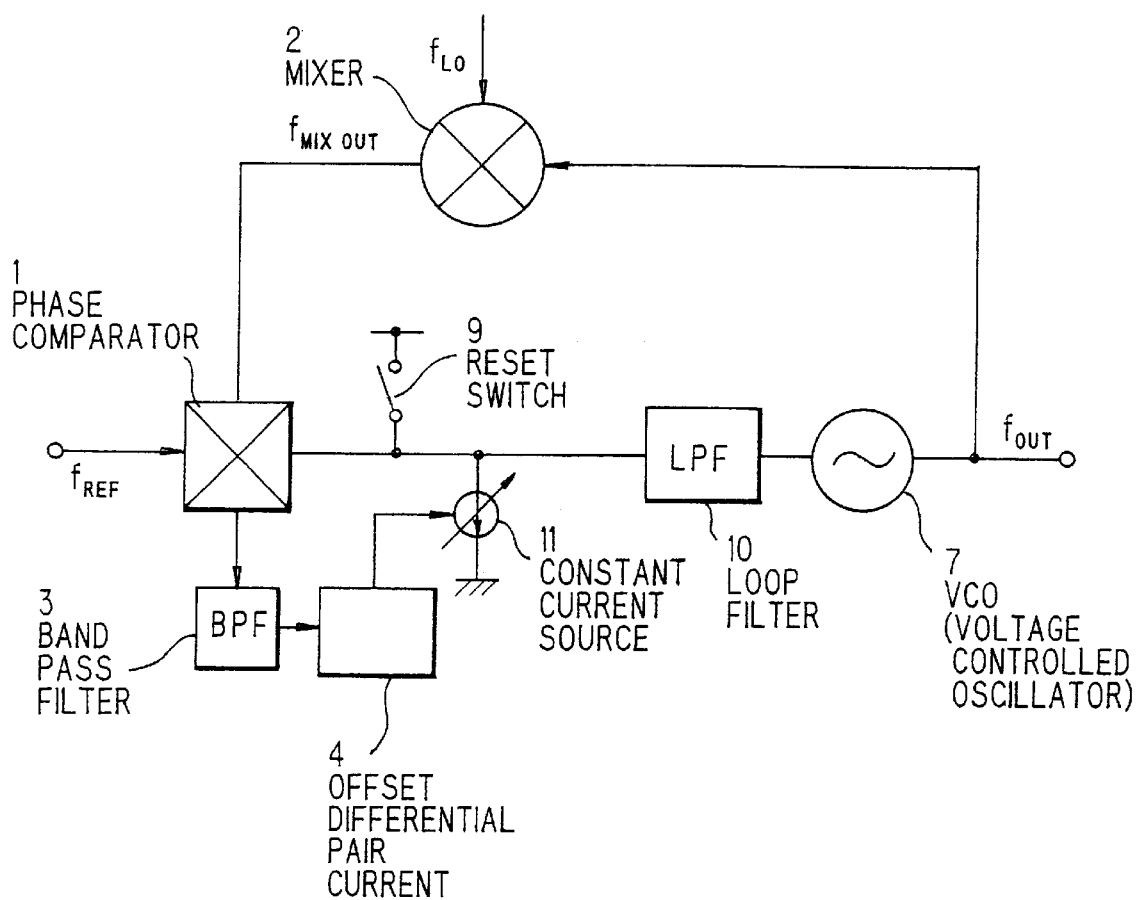
FIG. 7 is a block diagram showing a third preferred embodiment of the invention.

Like parts are identified with the same reference numerals throughout FIG. 6 and FIG. 7, and the overlapping explanation will be omitted. This preferred embodiment is different from the preferred embodiment shown in FIG. 6 in that, in the construction shown in FIG. 6, the connection of the reset switch 9 has been changed from the ground side to the power source $V_B$ side and, in addition, a variable constant current source 11 is connected between the output line and the ground in the phase comparator 1.

When PLL is not in the state of operation (for example, at the time of switching of the frequency channel and at the turn-on time of the power), the reset switch 9 is turned ON, the loop filter 10 is charged, and the control voltage of VCO 7 is increased to the level of the power voltage. When the PLL circuit is operated, the reset switch 9 is turned OFF. Just as the reset switch 9 has been turned OFF, the control voltage of VCO 7 is 0 V and the output signal $f_{out}$ of VCO 7 is in the upper limit of the operation oscillation frequency.

At that time, when the output signal $f_{pd\ out}$ (=|$f_{REF}$−$f_{MIX\ OUT}$|) of the phase comparator 1 does not fall within the capture range of the PLL circuit, BPF 3 and the offset differential pair circuit 4 are operated and the variable constant current source 11 is turned ON. The operation of the variable constant current source 11 results in discharge of charges of the capacitor of LPF 10. This causes the output voltage of LPF 10 to be linearly lowered from the power voltage, and, accordingly, the output signal $f_{OUT}$ of VCO 7 is lowered from the upper limit of the operation oscillation frequency.

When the output signal $f_{pd\ out}$ of the phase comparator 1 falls within the capture range of the PLL circuit, BPF 3 and the offset differential pair circuit 4 are operated to turn OFF the operation of the variable constant current source 11. By virtue of this, the PLL circuit is brought to lock-in by the original PLL operation. Therefore, also in this preferred embodiment, shortening of the lock-up time is possible. Further, even when lock-up is done using a constant current source, connection is not always done. Therefore, there is no limitation on current setting. Further, there is no fear of increasing noise and spurious harmonics.

It should be noted that the invention is not limited to the above preferred embodiments, and variations and modifications can be effected within the technical idea of the invention.

For example, in the construction shown in FIG. 2, the time constant of LPF 6 is switched by the changeover switch 5. This can be changed to a construction shown in FIG. 8.

Figure 8:
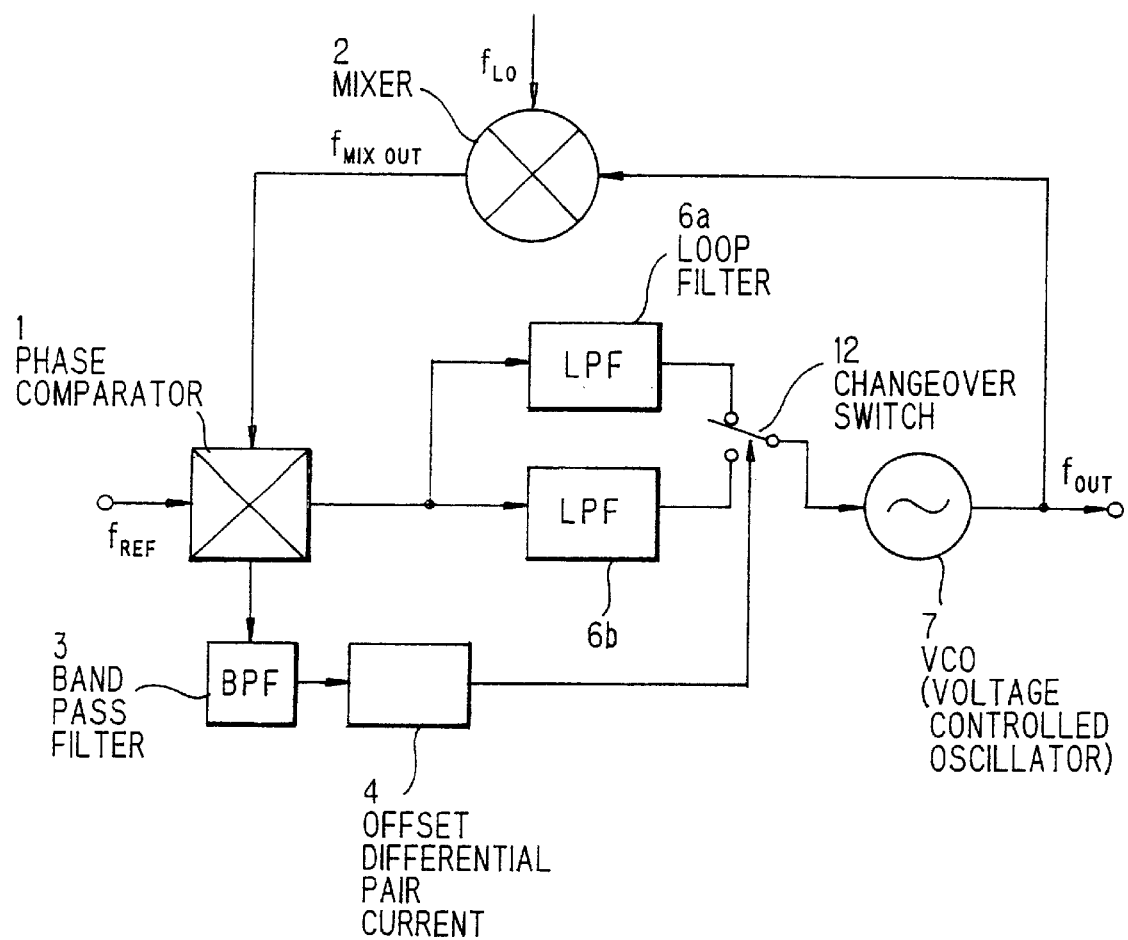
FIG. 8 is a block diagram showing a variant of the PLL circuit shown in FIG. 2.

FIG. 8 shows a variant of the first preferred embodiment.

Like parts are identified with the same reference numerals throughout FIG. 8 and FIG. 2, and the overlapping explanation will be omitted.

This preferred embodiment is characterized in that two LPFs 6a, 6b are used as LPF and are switched by a changeover switch 12. In LPF 6a, the circuit time constant is small, and the band width is large, while, in LPF 6b, the circuit time constant is large and the band width is narrow.

When the PLL circuit is outside the capture range, LPF 6a is selected by the changeover switch 12. On the other hand, when the PLL circuit falls within the capture range, LPF 6b is selected. According to this construction, the circuit time constant can be freely set for each of LPFs, and, thus, the degree of freedom in design can be advantageously improved.

As is apparent from the foregoing description, in the PLL circuit according to the first feature of the invention, a detector detects such a state that the PLL circuit is not in a lockable state. At the time of this detection, switching is carried out by switch means so that the response of the loop filter is enhanced. Therefore, the lock-up time can be shortened. Further, noise and spurious harmonics can be reduced.

In the PLL circuit according to the second feature of the invention, the detector detects such a state that the PLL circuit is not in a lockable state. At the time of the detection, a constant current source is turned on by switch means, and current is allowed to flow from the constant current source to a loop filter. Therefore, the lock-up time can be shortened. Further, noise and spurious harmonics can be reduced, and there is no limitation on current setting.

The invention has been described in detail with particular reference to preferred embodiments, but it will be understood that variations and modifications can be effected within the scope of the invention as set forth in the appended claims.

What is claimed is:

1. A PLL circuit comprising:
    a phase comparator which outputs, as a phase difference signal, a difference in phase between first and second input signals,
    a loop filter which smoothens said phase difference signal and outputs a smoothened voltage output;
    VCO (voltage control oscillator) which receives as input the smoothened voltage output from the loop filter and oscillates at a frequency depending upon said smoothened voltages output;
    a mixer which is provided between said VCO and the phase comparator and generates, as the second input signal, a signal of which a target frequency is the frequency of the first input signal;
    a detector which detects, based on said phase differential signal output from the phase comparator, whether or not PLL (phase-lock loop) lock is possible, wherein the detector comprises a band pass filter which has a band width corresponding to a difference in frequency between the first and second input signals and receives as input said phase differential signal output from the phase comparator, and a differential pair circuit which receives as input a voltage signal output from the band pass filter and outputs a voltage corresponding to a voltage signal output received from said band pass filter; and
    switch means which, when the detector has detected that PLL lock is impossible, switches the loop filter so that the response of the loop filter is enhanced.

2. The PLL circuit according to claim 1, wherein said PLL circuit has a capture range, and wherein, in the band pass filter, the cut-off frequency on the lower frequency side is set to the lower limit of said capture range while the cut-off frequency on the upper frequency side is set to the upper limit of the operation frequency range of said VCO.

3. The PLL circuit according to claim 1, wherein the differential pair circuit generates said output voltage up to the upper limit and down to the lower limit of the frequency band with the center of the frequency band in the band pass filter being regarded as peak.

4. The PLL circuit according to claim 3, wherein the differential pair circuit comprises:
    a first differential circuit wherein a first transistor in its emitter is connected to a second transistor in its emitter, signals having positive and reversed phases from the band pass filter are input into respective bases, and the first transistor in its collector serves as a first output terminal and, in addition, is connected to a power source through a first resistor;
    a second differential circuit wherein a third transistor in its emitter is connected to a fourth transistor in its emitter, said signals having positive and reversed phases from the band pass filter are input into respective bases, the third transistor in its collector is connected to the first transistor in its collector, the fourth transistor in its collector is connected to the second transistor in its collector, serves as a second output terminal and, in addition, is connected to the power source through the second resistor, and wherein
        the emitter of each of the second and fourth transistors has an area obtained by multiplying the emitter area of each of the first and third transistors by a predetermined value, N.

5. The PLL circuit according to claim 1, wherein the differential pair circuit comprises:
    a first differential circuit wherein a first transistor in its emitter is connected to a second transistor in its emitter, signals having positive and reversed phases from the band pass filter are input into respective bases, and the first transistor in its collector serves as a first output terminal and, in addition, is connected to a power source through a first resistor;
    a second differential circuit wherein a third transistor in its emitter is connected to a fourth transistor in its emitter, said signals having positive and reversed phases from the band pass filter are input into respective bases, the third transistor in its collector is connected to the first transistor in its collector, the fourth transistor in its collector is connected to the second transistor in its collector, serves as a second output terminal and, in addition, is connected to the power source through the second resistor, and wherein
        the emitter of each of the second and fourth transistors has an area obtained by multiplying the emitter area of each of the first and third transistors by a predetermined value, N.

6. A PLL circuit comprising:
    a phase comparator which outputs, as a phase difference signal, a difference in phase between first and second input signals;
    a loop filter which smoothens said phase difference signal and outputs a smoothened voltage output;
    VCO (voltage control oscillator) which receives as input the smoothened voltage output from the loop filter and oscillates at a frequency depending upon said smoothened voltage output;
    a mixer which is provided between said VCO and the phase comparator and generates, as the second input signal, a signal of which a target frequency is the frequency of the first input signal;
    a detector which detects, based on said phase differential signal output from the phase comparator, whether or not PLL (phase-lock loop) lock is possible; and
    switch means which, when the detector has detected that PLL lock is impossible, switches the loop filter so that the response of the loop filter is enhanced;

wherein the loop filter comprises a first loop filter having a small time constant and a second loop filter having a large time constant; and wherein the switch means selects the first loop filter when the detector detects such a state that PLL lock is impossible, while the switch means selects the second loop filter when PLL lock is possible.

7. A PLL circuit comprising:

a current output-type phase comparator which outputs, as a phase difference signal, a difference in phase between first and second input signals;

a loop filter which smoothens said phase difference signal and outputs a smoothened voltage output;

a constant current source for supplying current to the loop filter at a predetermined time;

a detector which detects, based on said phase differential signal output from the phase comparator, whether or not said PLL lock is possible;

a reset switch coupled to said detector, said reset switch connected between the input terminal of the loop filter and ground and, when PLL (phase-lock loop) lock is possible, is turned off and, when said PLL lock is impossible, is turned on;

VCO (voltage control oscillator) which receives as input the smoothened voltage output from the loop filter and oscillates at a frequency depending upon said smoothened voltage output;

a mixer which is provided between said VCO and the phase comparator and generates, as the second input signal, a signal of which a target frequency is the frequency of the first input signal; and switch means which, when the detector has detected that PLL lock is impossible, turns on the constant current source.

8. The PLL circuit according to claim 7, wherein the detector comprises:

a band pass filter which has a band width corresponding to a difference in frequency between the first and second input signals and receives as input said phase differential signal output from the phase comparator; and a differential pair circuit which receives as input a voltage signal output from the band pass filter and outputs a voltage corresponding to said voltage signal output received from said band pass filter.

9. The PLL circuit according to claim 8, wherein said PLL circuit has a capture range, and wherein, in the band pass filter, the cut-off frequency on the lower frequency side is set to the lower limit of said capture range while the cut-off frequency on the upper frequency side is set to the upper limit of the operation frequency range of said VCO.

10. The PLL circuit according to claim 8, wherein the differential pair circuit generates said output voltage up to the upper limit and down to the lower limit of the frequency band with the center of the frequency band in the band pass filter being regarded as peak.

11. The PLL circuit according to claim 10, wherein the differential pair circuit comprises:

a first differential circuit wherein a first transistor in its emitter is connected to a second transistor in its emitter, signals having positive and reversed phases from the band pass filter are input into respective bases, and the first transistor in its collector is connected to a power source through a first resistor;

a second differential circuit wherein a third transistor in its emitter is connected to a fourth transistor in its emitter, said signals having positive and reversed phases from the band pass filter are input into respective bases, the third transistor in its collector is connected to the first transistor in its collector, the fourth transistor in its collector is connected to the second transistor in its collector and, in addition, is connected to the power source through the second resistor, and wherein the emitter of each of the second and fourth transistors has an area obtained by multiplying the emitter area of each of the first and third transistors by a predetermined value, N.

12. The PLL circuit according to claim 8, wherein the differential pair circuit comprises:

a first differential circuit wherein a first transistor in its emitter is connected to a second transistor in its emitter, signals having positive and reversed phases from the band pass filter are input into respective bases, and the first transistor in its collector is connected to a power source through a first resistor;

a second differential circuit wherein a third transistor in its emitter is connected to a fourth transistor in its emitter, said signals having positive and reversed phases from the band pass filter are input into respective bases, the third transistor in its collector is connected to the first transistor in its collector, the fourth transistor in its collector is connected to the second transistor in its collector and, in addition, is connected to the power source through the second resistor, and wherein the emitter of each of the second and fourth transistors has an area obtained by multiplying the emitter area of each of the first and third transistors by a predetermined value, N.

13. The PLL circuit according to claim 7, wherein the position of the reset switch and the position of the constant current source are reversed.

14. The PLL circuit according to claim 7, wherein, in the constant current source, the power supply voltage is greater than the input voltage received by said VCO when said PLL is locked.

* * * * *

UNITED STATES PATENT AND TRADEMARK OFFICE
CERTIFICATE OF CORRECTION

PATENT NO. : 6,466,067 B2
DATED : October 15, 2002
INVENTOR(S) : Matsui, Naohiro It is certified that error appears in the above-identified patent and that said Letters Patent is hereby corrected as shown below:

Column 9,
Line 38, "voltages" should be -- voltage --.

Signed and Sealed this

Twenty-fifth Day of May, 2004

JON W. DUDAS
*Acting Director of the United States Patent and Trademark Office*